United States Patent [19]
Ryat

[11] Patent Number: 5,294,892
[45] Date of Patent: Mar. 15, 1994

[54] TWO-STAGE RAIL-TO-RAIL CLASS AB OPERATIONAL AMPLIFIER

[75] Inventor: Marc H. Ryat, Santa Clara, Calif.

[73] Assignee: SGS-Thomson Microelectronics, Inc., Carrollton, Tex.

[21] Appl. No.: 946,765

[22] Filed: Sep. 17, 1992

[51] Int. Cl.$^5$ .............................................. H03F 3/45
[52] U.S. Cl. ................................... 330/253; 330/255; 330/257
[58] Field of Search ................. 330/252, 253, 255, 257

[56] References Cited

U.S. PATENT DOCUMENTS 4,240,040 12/1980 Saari ................................... 330/255
4,333,058 6/1982 Hoover ........................... 330/255 X

OTHER PUBLICATIONS

R. J. Wildar, "Low-voltage techniques", IEEE Jour. solid State Cir., vol. SC-13, pp. 836-846, Dec. 1978.

Huijsing et al., "Low-voltage operational amplifier with rail-to-rail input and output ranges", IEEE J. Solid State Cir., vol. SC-20, No. 6 pp. 1144-1150, Dec. 1985.

Fonderie et al., IEEE J. Solid State Cir., vol. SC-24, No. 6, pp. 1551-1559 Dec. 1989.

Callewaert et al, "Class AB CMOS amplifiers with high efficiency", IEEE J. Solid State Cir., vol. 25, No. 3, pp. 684-692, Jun. 1990.

Brehmer et al., "Large-swing CMOS power amplifier", IEEE J. Solid State Cir. vol. SC-18, pp. 624-629, Dec. 1983.

Fisher, "A high-performance CMOS power amplifier", IEEE J. Solid State Cir. vol. SC-20, No. 6, pp. 1200-1205, Dec. 1985.

Monticelli, "A quad CMOS single-supply op amp with rail-to-rail output swing", IEEE J. Solid State Cir., vol. SC-21, No. 6, pp. 1026-1034, Dec. 1986.

Fisher, "A highly linear CMOS buffer amplifier", IEEE J. Solid State Cir. vol. SC-22, No. 3, pp. 330-334, Jun. 1987.

Steyaier et al, "A high-dynamic-range CMOS op amp with low-distortion output structure", IEEE J. Solid State Cir., vol. SC-22, No. 6, pp. 1204-1207 Dec. 1987.

Babenezhad, "A rail-to-rail CMOS op amp", IEEE J. Solid State Cir., vol. SC-23 No. 6, pp. 1414-1417, Dec. 1988.

(List continued on next page.)

*Primary Examiner*—James B. Mullins
*Attorney, Agent, or Firm*—Richard A. Bachand; Lisa K. Jorgenson; Richard K. Robinson

[57] ABSTRACT

An operational amplifier having a differential signal input and an output has an input stage comprising a differential amplifier having a differential signal input and a differential signal output. The differential amplifier includes a first pair of transistors of opposite conductivity type having control elements connected to receive one side of the differential signal input, and second and third pairs of transistors of opposite conductivity type having control elements connected to receive another side of the differential signal input. The differential output of the differential amplifier is developed by outputs of the second and third pairs of transistors. A high-swing output section is connected to receive the differential signal output directly from the input stage. The differential amplifier has first and second current sources connected respectively between transistors of the first, second and third transistor pairs of a first conductivity type and a voltage supply, and between transistors of the first, second and third transistor pairs of a second conductivity type and a reference potential. A summing circuit is also provided in the input stage for summing the currents in the first, second, and third transistor pairs to produce the differential output of the input stage. The operational amplifier can be constructed of either bipolar or MOS transistors. One embodiment of the circuit provides an improved power supply rejection ratio through the use of current mirrors in a differential summing circuit to maintain output nodes of the input circuit at voltages within $2V_{BE}$ of the supply voltage and reference potential, or ground.

21 Claims, 5 Drawing Sheets

OTHER PUBLICATIONS

Pardoen et al. "A rail-to-rail input/output CMOS power amplifier", IEEE J. Solid State Cir., vol. SC-25, No. 2, pp. 501-504, Apr. 1990.

Babanezhad et al., "A programmable gain/loss circuit", IEEE J. Solid State Cir., vol. SC-22, No. 6, pp. 1082-1090, Dec. 1987.

Nagaraj, "Large-swing CMOS buffer amplifier", IEEE J. Solid State Cir., vol. SC-24, pp. 181-183, Feb. 1989.

Mistlberger et al., "Class-AB high-swing CMOS power amplifier", IEEE J. Solid State Cir., vol. SC-27, No. 7, pp. 1089-1092, Jul. 1992.

Malhi et al., "A low-voltage micropower JFET/bipolar operational amplifier", IEEE J. Solid State Cir., vol. SC-16, No. 6, pp. 669-676, Dec. 1981.

Davis et al., "Design techniques for improving the HF response of a monolithic JFET operational amplifier", IEEE J. S. State Cir., vol. SC-19, No. 6, pp. 978-985 Dec. 1984.

Vyne et al., "A monolithic P-channel JFET quad op amp with in-package trim and enhanced gain-bandwidth product", IEEE J. S. State Cir., vol. SC-22, No. 6, pp. 1130-1138, Dec. 1987.

Seevinck et al., "A low-distortion output stage with improved stability for monolithic power amplifiers", IEEE J. Solid State Cir., vol. SC-23, No. 3 pp. 794-801 Jun. 1988.

Widlar et al., "A monolithic power op amp", IEEE J. S. State Cir., vol. SC-23, No. 2, pp. 527-535, Apr. 1988.

Quiting, "A CMOS power amplifier with a novel output structure", IEEE J. Solid State Cir., vol. SC-27, No. 2, pp. 203-207, Feb. 1992.

Fondirie et al., "Operational amplifier with 1-V rail-to-rail multipath-driven Output Stage", IEEE J. Solid State Cir., vol. 26, No. 12, Dec. 1991.

Gilbert, "A new wide-band amplifier technique", IEEE J. Solid State Cir., vol. SC-3 No. 4, Dec. 1968.

Castello et al., "A high-performance micropower switched-capacitor Filter", IEREE J. Solid State Cir., vol. SC-20, No. 6, Dec. 1985.

Fiez et al., "A family of high-swing CMOS operational amplifiers", IEEE J. Solid State Cir., vol. 24, No. 6, pp. 1683-1687, Dec. 1989.

Op't Eynde et al., "A CMOS large-swing low-distortion three-stage class AB power amplifier", IEEE J. Solid State Cir., pp. 265-273, vol. 25, No. 1, Feb. 1990.

Lee et al., "A high slwe-rate CMOS amplifier for analog signal processing", IEEE J. Solid State Cir., vol. 25, No. 3, pp. 885-889, Jun. 1990.

TWO-STAGE RAIL-TO-RAIL CLASS AB OPERATIONAL AMPLIFIER

CROSS-REFERENCE TO RELATED APPLICATIONS

This application is related to U.S. patent application Ser. No. 07/946,764 filed Sep. 17, 1992, incorporated herein by reference.

BACKGROUND OF THE INVENTION

1. Field of the Invention

This invention relates to improvements in operational amplifiers, and more particularly to improvements in operational amplifiers that have wide operating voltage ranges approaching rail-to-rail swings, and still more particularly to techniques in reducing the size and complexity of operational amplifiers.

2. Background Information

Recently, increased interest has been directed towards realizing low distortion class AB operational amplifiers that have a wide range of input and output voltages, approaching the upper and lower supply voltages rails. It is desirable, of course that the amplifier be capable of being realized in a monolithic integrated circuit structure of bipolar or MOS transistor devices. In the past, however, only large-size, often three-stage structures have been proposed to achieve the desired performance, resulting in a large cost in silicon area, particularly for circuits having to work under low supply constraints.

For example, Johan H. Huijsing et al., in "Low-Voltage Operational Amplifier with Rail-to-Rail Input and Output Ranges", *IEEE Journal of Solid-State Circuits*, Vol. SC-20, No. 6, December, 1985, discloses an operational amplifier that can operate with a supply voltage as low as 1.5 volts. The output voltage can reach the supply rail within 150 mV. The circuit has an input stage that provides rail-to-rail common-mode voltage range and an output stage with rail-to-rail output-voltage swing and accurate class AB control. The circuit, however, requires an intermediate stage to allow the input and output stages to be connected together to produce sufficient voltage gain to enable the circuit to be used as a general purpose operational amplifier. The provision of the third stage not only increases the size and complexity of the circuit, it reduces the circuit bandwidth and speed.

Jeroen Fonderie et al., in "1-V Operational Amplifier with Rail-to-Rail Input and Output Ranges", *IEEE Journal of Solid-State Circuits*, Vol. 24, No. 6, December, 1989, shows a bipolar operational amplifier with rail-to-rail input and output ranges for low supply voltages. This circuit again requires a large number of components and an intermediate stage between the input and output stages. Being a three-stage design, its composition is relatively complicated, and has a bandwidth limited to approximately 450 kHz.

SUMMARY OF THE INVENTION

In light of the above, it is, therefore, an object of the invention to provide an improved low voltage operational amplifier with rail-to-rail input and output ranges.

It is another object of the invention to provide an improved operational amplifier that can be operated at relatively low voltages with fewer components and reduced circuitry complexity with an increased bandwidth.

It is yet another object of the invention to provide an improved amplifier output stage with accurate class AB current control.

It is yet another object of the invention to provide a circuit that has reduced power supply requirements that enables an input stage to be connected directly to an output stage without an intermediate level shifting stage.

It is still another object of the invention to provide an improved operational amplifier that can be realized in bipolar technology with normal power supply rejection ratios, high gain, and high bandwidth.

It is still another object of the invention to provide an improved operational amplifier of the type described that can be realized in MOS type components as well as bipolar components and can be integrated onto a single semiconductor substrate.

These and other objects, features and advantages of the invention will be apparent to those skilled in the art from the following detailed description of the invention, when read in conjunction with the accompanying drawings and appended claims.

In accordance with a broad aspect of the invention, a two-stage operational amplifier having a differential signal input and an output includes a differential input circuit having a single gain stage with a gain of between about 50 and 90 db for connection to receive a differential signal input to produce an amplified differential output signal. A high swing output section having a gain of between about 50 and 60 db is connected to receive said differential signal output directly from said differential input circuit.

In accordance with another broad aspect of the invention, an operational amplifier having a differential signal input and an output is presented. The amplifier has an input stage comprising a differential amplifier having a differential signal input and a differential signal output. The differential amplifier includes a first pair of transistors of opposite conductivity type having control elements connected to receive one side of the differential signal input, and second and third pairs of transistors of opposite conductivity type having control elements connected to receive another side of the differential signal input. The differential output of the differential amplifier is developed by outputs of the second and third pairs of transistors. A high-swing output section is connected to receive the differential signal output directly from the input stage.

The differential amplifier has first and second current sources connected respectively between transistors of the first, second and third transistor pairs of a first conductivity type and a voltage supply, and between transistors of the first, second and third transistor pairs of a second conductivity type and a reference potential. A summing circuit is also provided in the input stage for summing the currents in the first, second, and third transistor pairs to produce the differential output of the input stage.

The operational amplifier can be constructed of either bipolar or MOS transistors.

In accordance with another broad aspect of the invention, an operational amplifier having a differential signal input and an output is presented that has an improved power supply rejection ratio. The circuit has an input stage comprising a differential amplifier having a differential signal input and a differential signal output.

The differential amplifier includes a first pair of transistors of opposite conductivity type having control elements connected to receive one side of the differential signal input. A second and third pair of transistors of opposite conductivity type has their control elements connected to receive another side of the differential signal input, the differential output of the differential amplifier being developed by outputs of the second and third pairs of transistors. A summing circuit sums the currents in the first, second, and third transistor pairs to produce the differential output of the input stage on first and second differential output nodes. A circuit is provided to clamp the first and second differential output nodes at a predetermined level with respect to the supply voltage and reference potential, and a high-swing output section is connected to receive the differential signal output directly from the input stage.

The first and second differential output nodes are clamped respectively at a voltage of 2 $V_{BE}$ below the supply voltage, and 2 $V_{BE}$ above the reference potential. These voltage levels are controlled by first and second current mirror circuits in the summing circuit that use outputs from the differential input stage for reference. More particularly, a fourth pair of transistors of opposite conductivity type has control elements connected to receive the one side of the differential signal input, and the first and second current mirrors mirror currents produced by the first and fourth pair of transistors of opposite conductivity type.

The summing circuit in this embodiment has first, second, third and fourth series circuits, each comprising a first resistor, a first transistor of one conductivity type, a second transistor of opposite conductivity type, and a second resistor connected between the voltage supply and the reference potential. The output of the transistor of the first transistor pair of first conductivity type is connected between the first resistor and first transistor of the first series circuit, and the outputs of the transistor of the first transistor pair of second conductivity type is connected between the second resistor and second transistor of the first series circuit. The output of the transistor of the second transistor pair of first conductivity type is connected between the first resistor and first transistor of the second series circuit, and the outputs of the transistor of the second transistor pair of second conductivity type is connected between the second resistor and second transistor of the second series circuit. The output of the transistor of the third transistor pair of first conductivity type is connected between the first resistor and first transistor of the third series circuit, and the outputs of the transistor of the third transistor pair of second conductivity type is connected between the second resistor and second transistor of the third series circuit. The output of the transistor of the fourth transistor pair of first conductivity type is connected between the first resistor and first transistor of the fourth series circuit, and the outputs of the transistor of the fourth transistor pair of second conductivity type is connected between the second resistor and second transistor of the fourth series circuit.

In all embodiments, a circuit can be provided to bias the high-swing output section to operate, in class-AB mode. In addition, the operational amplifier can be implemented with bipolar transistors, MOS transistors, or some combination thereof.

BRIEF DESCRIPTION OF THE DRAWINGS

The invention is illustrated in the accompanying drawings in which.

In the various drawings, like reference numerals are used to denote like or similar parts.

DETAILED DESCRIPTION OF THE PREFERRED EMBODIMENTS

Figure 1:
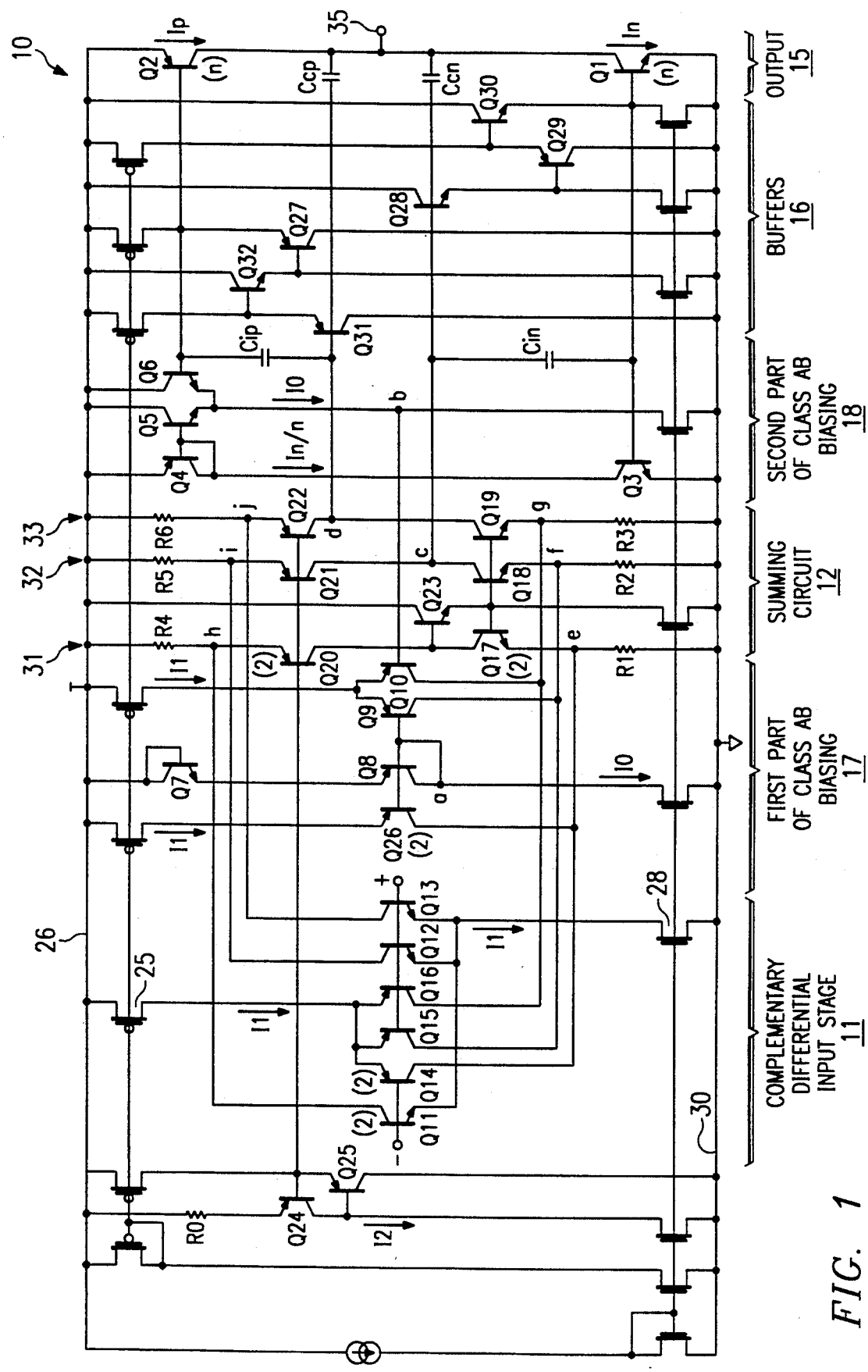
FIG. 1 is an electrical schematic diagram of a two-stage operational amplifier fabricated with bipolar transistors, in accordance with a preferred embodiment of the invention.

An electrical schematic diagram of a bipolar embodiment of an operational amplifier 10 in accordance with the invention is shown in FIG. 2. In contrast to the operational amplifier circuits of the prior art, the operational amplifier 10 requires only two gain stages. The first gain stage comprises a differential input 11 and a current summing circuit 12. The output circuit includes a high-swing output 15 that receives a buffered differential output appearing on high impedance nodes "c" and "d" via buffer stage 16. The output amplifier is biased in class AB mode by AB mode biasing circuitry 17 and 18.

The complementary differential input stage 11 includes transistors Q11, Q12, Q13, Q14, Q15, and Q16. The transistors Q11–Q16 are connected in differential pairs. A first transistor pair, Q11 and Q14 are of opposite conductivity type, Q11 being an NPN transistor and Q14 being a PNP transistor. The bases of the transistors Q11 and Q14 are adapted to be connected to receive an inverting input of a differential input signal.

On the other hand, a second pair of transistors of opposite conductivity type is provided by PNP transistor Q16 and NPN transistor Q13. Additionally, a third pair of transistors of opposite conductivity type is provided by transistors Q12 and Q15. The bases of transistors Q12, Q13, Q15, and Q16 are adapted to be connected to receive a non-inverted input of the differential input signal.

The emitters of the PNP transistors Q14, Q15, and Q16 are connected to a current source 25 that is connected, in turn, to a $V_{cc}$ or voltage supply rail 26 (hereinafter the supply rail 26). On the other hand, the emitters of the NPN transistors Q11, Q12, and Q13 are connected to a current source 28 that is connected, in turn, to a reference potential, or ground rail 30 (hereinafter the ground rail 30). The currents flowing in the complementary differential input stage 11 are summed in the summing circuit 12 which includes three similarly constructed current paths, 31, 32, and 33. The current path 31 includes a resistor R4 connected between the supply rail 26 and the emitter of a PNP transistor Q20. The collector of the transistor Q20 is connected to the collector of an NPN transistor Q17. The emitter of the transistor Q17 is connected to a second resistor R1 that is connected, in turn, to the ground rail 30. The current path 32 is similarly constructed and includes a first resistor R5, a first transistor Q21, a second transistor Q18, and a second resistor R2 connected between a supply rail 26 and ground rail 30, as shown. Finally, the current path 33 includes a first resistor R6, a first transistor Q22, a second transistor Q19, and a second resistor R3 connected in a similar fashion between the supply rail 26 and ground rail 30. The output from the input stage 11 is derived on high impedance nodes "c" and "d" at the respective junctions between transistors Q21 and Q18 and transistors Q22 and Q19.

A current mirror is provided by a circuit including an NPN transistor Q23 that biases the bases of the NPN transistors Q17, Q18, and Q19, to maintain the voltage on node "c" at a predetermined level above the ground potential on the ground rail 30.

The output from the complementary input stage 11 is derived on the collectors of the various pairs of transistors therein. More particularly, the collector of transistor Q13 is connected at node "j" between the resistor R6 and the emitter of transistor Q22. The collector of the transistor Q12 is connected to node "i" between a resistor R5 and the emitter of transistor Q21. The collector of transistor Q11 is connected to node "h" between the resistor R4 and the emitter of transistor Q20. Similarly, the collector of transistor Q16 is connected to node "g" between the resistor R3 and the transistor Q19. The collector of transistor Q15 is connected to node "f" between the resistor R2 and the emitter of transistor Q18. The collector of transistor Q14 is connected to node "e" between resistor R1 and the emitter of transistor Q17. Thus, it can be seen that the current path 31 serves as a reference, the signal on which being derived from the inverting input to the complementary input stage 11 with respect to the current paths 32 and 33, the signals on which being derived from the non-inverting input on the complementary differential input stage 11.

The high-swing output stage 15 receives the amplified differential signal from the first stage on high impedance nodes "c" and "d" via buffers stage 16. More particularly, the amplified signal on node "d" is applied to the base of a PNP transistor Q31, which is connected in an emitter follower configuration with respect to the following transistor Q32. The transistor Q32 also is connected in an emitter follower configuration with respect to the base of transistor Q27. The transistor Q27, in turn, is connected in an emitter follower configuration with respect to the base of the output transistor Q2. Thus, the three emitter follower stages provided by transistors Q31, Q32, and Q27, provide a signal on the base of the NPN transistor Q2 that stays at 1 $V_{BE}$ below the voltage on the supply rail 26.

In a similar manner, a voltage output developed on the high impedance node "c" is applied to the base of the NPN transistor 28 that is connected in an emitter follower configuration with respect to the base of PNP transistor Q29. The PNP transistor Q29 is connected in an emitter follower configuration with respect to the base of an NPN transistor Q30. The NPN transistor Q30 is connected in an emitter follower configuration with respect to the base of the PNP output transistor Q1. Thus, the buffer action provided by the transistors Q28, Q29, and Q30 to the signal appearing at node "c" drives the base of Q1 at 1 $V_{BE}$ above the potential on the ground rail 30. Moreover, with respect to both of the buffer sets buffering the output signals on high impedance nodes "c" and "d", since three emitter follower stages are provided, excessive drive current is not drawn from the summing network 12.

The class AB mode biasing circuitry 17 and 18 is constructed in a fashion similar to that described in co-pending patent application Ser. No. 07/940,876, filed Sep. 3, 1992, by the applicant of the instant application, said co-pending application being assigned to the assignee hereof and incorporated herein by reference.

The high-swing output circuit 15 provides an output by complementary transistors Q1 and Q2 that approaches rail-to-rail voltages. The output from the output circuit 15 is derived on output node 35.

The circuitry 10 can be easily fabricated with standard bipolar devices to have a gain of between approximately 60 to 90 db, per stage, or between approximately 120 to 150 db, or more, overall, if desired, and can still achieve gains as high as 100 db or more with resistive loads oa low as 1K ohm. Since only two stages are required, the circuit 10 can easily be constructed without resort to complicated circuit or design considerations, and with fewer component parts than required of similar operational amplifiers that include three gain stages.

Figure 2A:
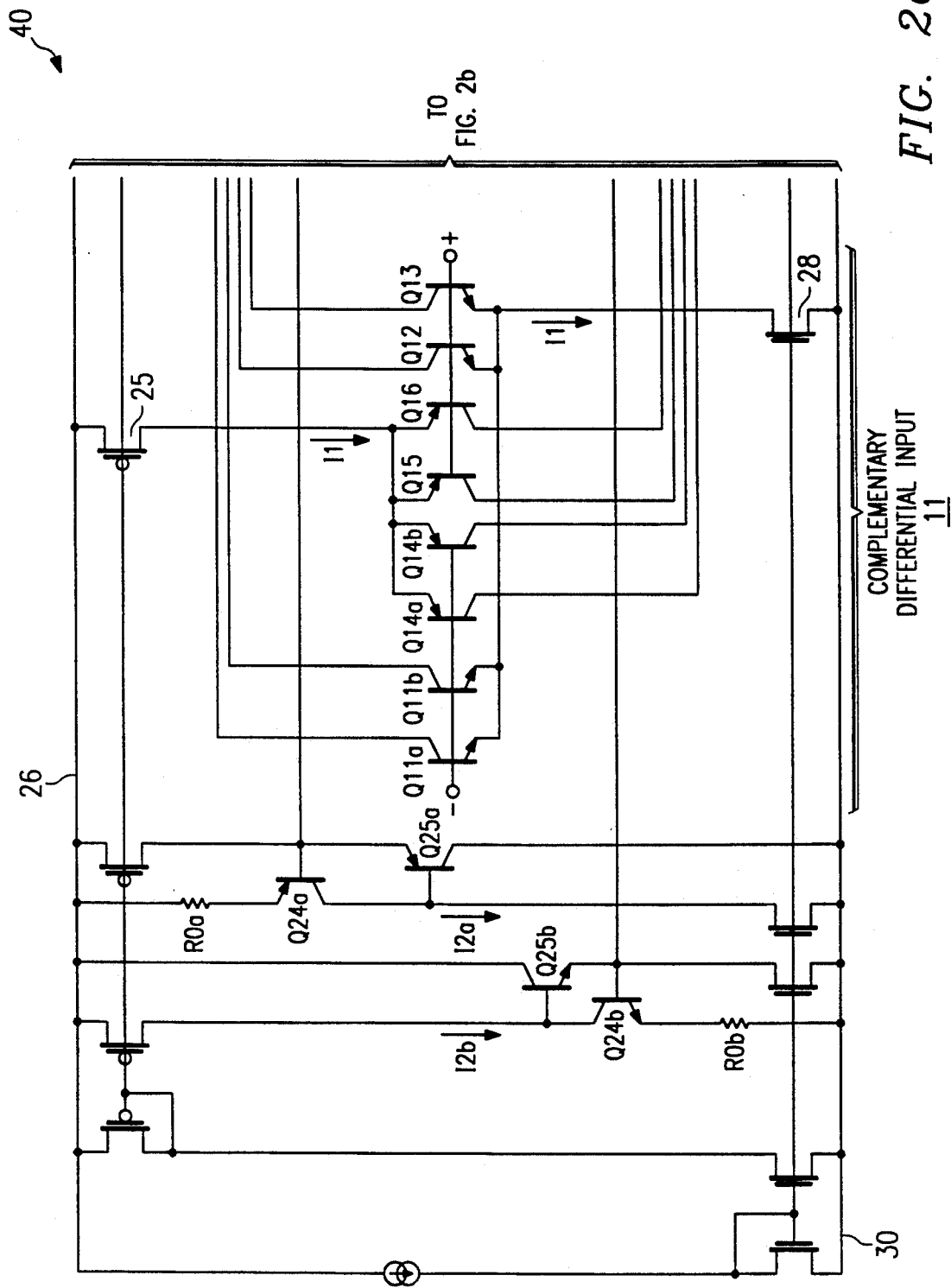
FIGS. 2a and 2b are electrical schematic diagrams of a two-stage operational amplifier also constructed with bipolar transistors that has an increased power supply rejection ratio, in accordance with another preferred embodiment of the invention.
Figure 2B:
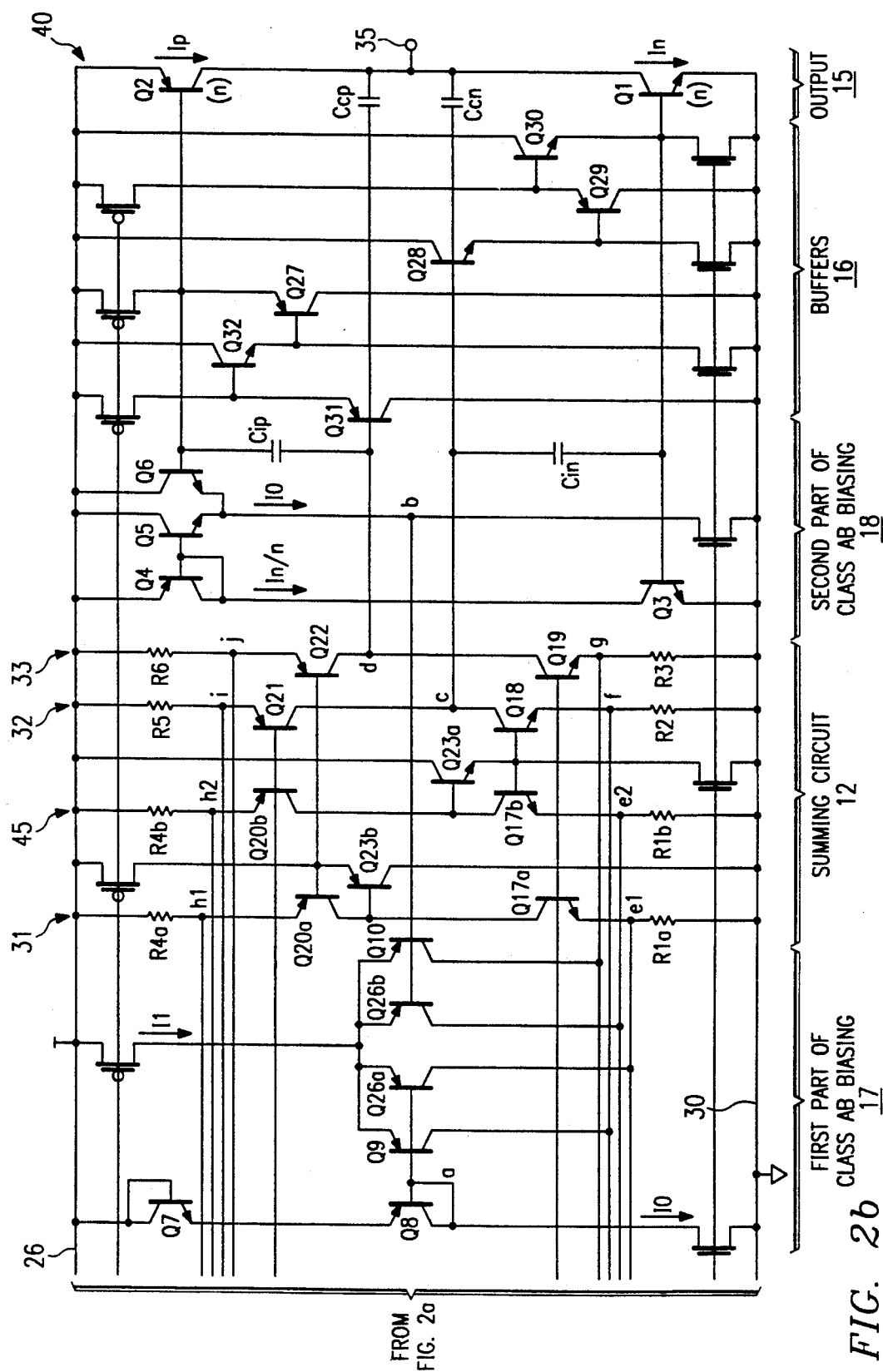

Another embodiment of an operational amplifier 40 in accordance with the invention is shown in FIGS. 2a and 2b. The operational amplifier 40 is constructed similarly to the operational amplifier 10 described above with reference to FIG. 1, except that two current mirrors are provided in the summing circuit. The first current mirror is provided by PNP transistor Q20a, which mirrors the current flowing in transistor Q17a. The second current mirror is provided by NPN transistor Q17b which mirrors the current flowing in PNP transistor Q20b. By virtue of the connection of the base of the PNP transistor Q31 to the collector of the PNP transistor Q22, the voltage on the high impedance node "d" is clamped at 2 $V_{BE}$ below the voltage on the supply rail 26. Likewise, by virtue of the connection of the emitter of the NPN transistor Q28 to the collector of the NPN transistor Q18, the voltage on the high impedance node "c" is clamped at 2 $V_{BE}$ above the voltage on the ground rail 30.

The summing circuit 12 includes an additional current flow path 45 that includes a first resistor R4b connected to the emitter of a PNP transistor Q20b. The collector of the transistor Q20b is connected to the collector of NPN transistor Q17b. The emitter of the transistor Q17b is connected to a second resistor R1b, which is, in turn, connected to the ground rail 30. With reference now to the complementary differential input stage 11, an additional pair of transistors of opposite conductivity type is included on the inverting signal side of the differential input amplifier. Thus, an NPN transistor Q11b has its emitter connected to the emitters of the other NPN transistors in the differential input amplifier of the complementary differential input stage 11. The collector of the transistor Q11b is connected to node "h2" between the resistor R4b and the emitter of the transistor Q20b in current flow path 45. Similarly, the emitter of transistor Q14b is connected to the emitters of the other PNP transistors of the complementary differential input stage 11. The collector of the PNP transistor Q14b is connected to node "e2" in the current path 45 between the lower resistor R1b and the emitter of the transistor Q17b. The remaining portions of the circuit 40 are essentially the same as that described above where current flow paths 31 and 33 act in a similar way as current flow paths 45 and 32. Because of the clamping of the high impedance nodes "c" and "d", to the predetermined voltages (for example, 2 $V_{BE}$ above ground and below V$_{cc}$), a better power supply rejection ratio (PSRR) can be achieved.

Figure 3A:
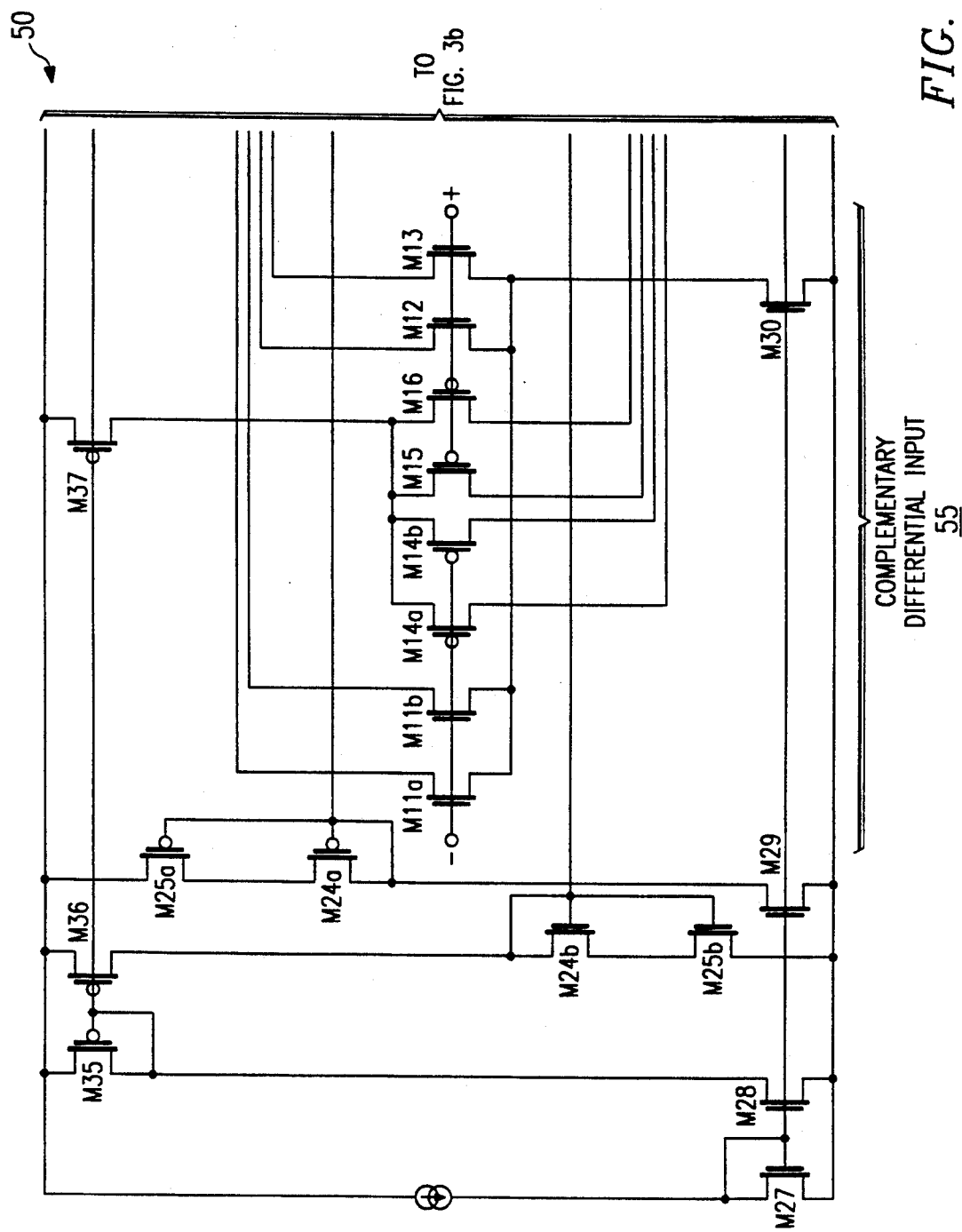
FIGS. 3a and 3b are electrical schematic diagrams of a two-stage operational amplifier fabricated with MOS transistors, in accordance with still another preferred embodiment of the invention.
Figure 3B:
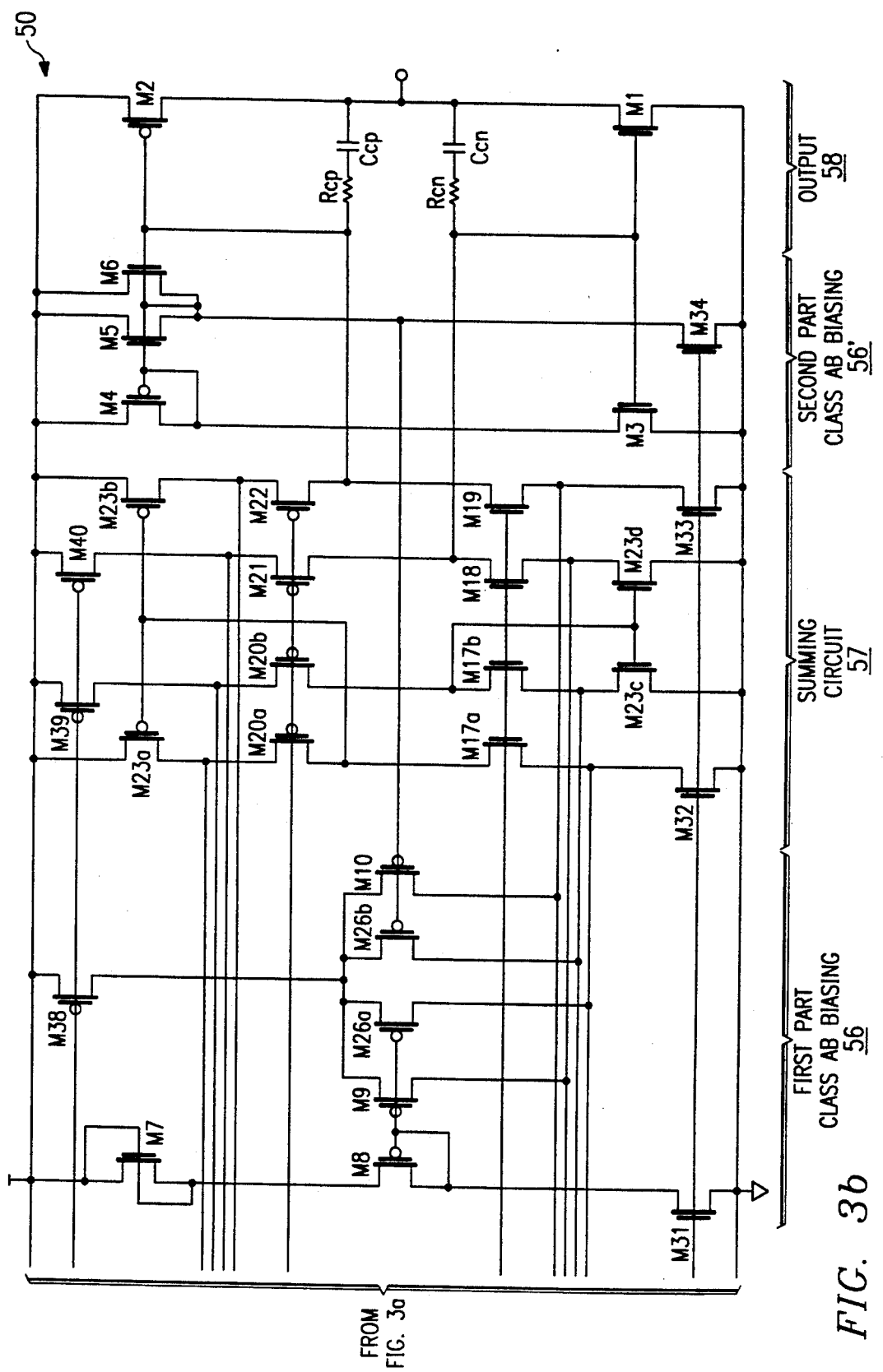

An operational amplifier 50 that has been implemented by MOS devices is shown in FIGS. 3a and 3b. The embodiment of FIGS. 3a and 3b is constructed in a manner similar to that of the embodiment 40 of FIGS. 2a and 2b. Thus, the operational amplifier 50 includes a complementary input stage 55, a class AB mode bias circuit 56 and 56', a summing circuit 57, and an output circuit 58.

It will be appreciated that the operational amplifier in accordance with the invention can be constructed with discrete components as well as components integrated onto a monolithic integrated circuit chip in bipolar, MOS, CMOS, or bi-CMOS processes.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An operational amplifier having a differential signal input and an output, comprising:
   a. an input stage comprising a differential amplifier having a differential signal input and a differential signal output, said differential amplifier including:
      i. a first pair of transistors of opposite conductivity type having control elements connected to receive one side of the differential signal input;
      ii. second and third pairs of transistors of opposite conductivity type having control elements connected to receive another side of the differential signal input, the differential output of said differential amplifier being developed by outputs of said second and third pairs of transistors;
   b. and a high-swing output section connected to receive said differential signal output directly from said input stage
   c. said differential amplifier further comprising first and second current sources connected respectively between transistors of said first, second and third transistor pairs of a first conductivity type and a voltage supply, and between transistors of said first, second and third transistor pairs of a second conductivity type and a reference potential.

2. The operational amplifier of claim 1 wherein said input stage further comprises a summing circuit for summing the currents in said first, second, and third transistor pairs to produce the differential output of the input stage.

3. The operational amplifier of claim 2 wherein said summing circuit comprises:
   three series circuits, each comprising a first resistor, a first transistor of one conductivity type, a second transistor of opposite conductivity type, and a second resistor connected between the voltage supply and the reference potential.

4. The operational amplifier of claim 3 wherein the outputs of the transistors of said first, second and third transistor pairs of first conductivity type are connected between the first resistor and first transistor of respective ones of said three series circuits, and the outputs of the transistors of said first, second and third transistor pairs of second conductivity type are connected between the second resistor and second transistor of respective ones of said three series circuits.

5. The operational amplifier of claim 1 wherein said first, second, and third pair of transistors are bipolar transistors.

6. The operational amplifier of claim 5 wherein said transistors of first conductivity type are PNP transistors, and wherein said transistors of second conductivity type are NPN transistors.

7. The operational amplifier of claim 1 wherein said first, second, and third pair of transistors are MOS transistors.

8. An operational amplifier having a differential signal input and an output, comprising:
   a. an input stage comprising a differential amplifier having a differential signal input and a differential signal output, said differential amplifier including:
      i. a first pair of transistors of opposite conductivity type having control elements connected to receive one side of the differential signal input;
      ii. second and third pairs of transistors of opposite conductivity type having control elements connected to receive another side of the differential signal input, the differential output of said differential amplifier being developed by outputs of said second and third pairs of transistors;
      iii. a summing circuit for summing the currents in said first, second, and third transistor pairs to produce the differential output of the input stage on first and second differential output nodes; and
      iv. a circuit for clamping the first and second differential output nodes at a predetermined level with respect to the supply voltage and reference potential;
   b. and a high-swing output section connected to receive said differential signal output directly from said input stage.

9. The operational amplifier of claim 8 wherein said circuit for clamping the first and second differential output nodes at a predetermined level with respect to the supply voltage and reference potential clamps the voltage at the first differential output node at a voltage of 2 V$_{BE}$ below the supply voltage, and clamps the voltage at the second differential output node at a voltage of 2 V$_{BE}$ above the reference potential.

10. The operational amplifier of claim 8 wherein said circuit for clamping the first and second differential output nodes at a predetermined level with respect to the supply voltage and reference potential comprise first and second current mirror circuits in said summing circuit.

11. The operational amplifier of claim 10 further comprising a fourth pair of transistors of opposite conductivity type having control elements connected to receive said one side of the differential signal input.

12. The operational amplifier of claim 10 wherein said differential amplifier further comprises first and second current sources connected respectively between transistors of said first and second pairs of a first conductivity type and a voltage supply, and between transistors of said first and second transistor pairs of a second conductivity type and a reference potential.

13. The operational amplifier of claim 12 wherein said first and second current mirrors mirror currents produced by said first and second pair of transistors of opposite conductivity type.

14. The operational amplifier of claim 13 wherein said summing circuit comprises:
   first, second, third and fourth series circuits, each comprising a first resistor, a first transistor of one conductivity type, a second transistor of opposite conductivity type, and a second resistor connected between the voltage supply and the reference potential.

15. The operational amplifier of claim 14 wherein:
the output of the transistor of said first transistor pair of first conductivity type is connected between the first resistor and first transistor of the first series circuit, and the outputs of the transistor of said first transistor pair of second conductivity type is connected between the second resistor and second transistor of said first series circuit;
the output of the transistor of said second transistor pair of first conductivity type is connected between the first resistor and first transistor of the second series circuit, and the outputs of the transistor of said second transistor pair of second conductivity type is connected between the second resistor and second transistor of said second series circuit;
the output of the transistor of said third transistor pair of first conductivity type is connected between the first resistor and first transistor of the third series circuit, and the outputs of the transistor of said third transistor pair of second conductivity type is connected between the second resistor and second transistor of said third series circuit;
the output of the transistor of said fourth transistor pair of first conductivity type is connected between the first resistor and first transistor of the fourth series circuit, and the outputs of the transistor of said fourth transistor pair of second conductivity type is connected between the second resistor and second transistor of said fourth series circuit.

16. The operational amplifier of claim 15 wherein said first, second, and third pair of transistors and said first and second transistors of said first, second, third and fourth series circuits, are bipolar transistors.

17. The operational amplifier of claim 16 wherein said transistors of first conductivity type are PNP transistors, and wherein said transistors of second conductivity type are NPN transistors.

18. The operational amplifier of claim 15 wherein said first, second, third, and fourth pair of transistors, and third pair of transistors and said first and second transistors of said first, second, third and fourth series circuits, are MOS transistors.

19. An operational amplifier having a differential signal input and an output, comprising:
a. an input stage comprising a differential amplifier having a differential signal input and a differential signal output, said differential amplifier including:
  i. a first and fourth pair of transistors of opposite conductivity type having control elements connected to receive one side of the differential signal input;
  ii. second and third pairs of transistors of opposite conductivity type having control elements connected to receive another side of the differential signal input, the differential output of said differential amplifier being developed by outputs of said second and third pairs of transistors;
  iii. a summing circuit for summing the currents in said first, second, third, and fourth transistor pairs to produce the differential output of the input stage on first and second differential output nodes; and
  iv. a circuit for clamping the first and second differential output nodes at a predetermined level with respect to the supply voltage and reference potential;
b. a high-swing output section connected to receive said differential signal output directly from said input stage;
c. and a circuit to bias said high-swing output section to operate in class-AB mode.

20. The operational amplifier of claim 19 wherein said operational amplifier is implemented with bipolar transistors.

21. The operational amplifier of claim 19 wherein said operational amplifier is implemented with MOS transistors.

* * * * *